(12) United States Patent
Zhu

(10) Patent No.: US 6,664,633 B1
(45) Date of Patent: Dec. 16, 2003

(54) ALKALINE COPPER PLATING

(75) Inventor: Mei Zhu, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 67 days.

(21) Appl. No.: 09/950,008

(22) Filed: Sep. 10, 2001

(51) Int. Cl.$^7$ ............ H01L 23/485; H01L 21/20; C25D 5/10; C25D 5/02; C23C 28/02
(52) U.S. Cl. ............ 257/751; 205/170; 205/184; 205/157; 205/102; 205/123; 438/584
(58) Field of Search ............ 205/184, 157, 205/123, 102; 257/751; 438/584

(56) References Cited

U.S. PATENT DOCUMENTS

| | | | | |
|---|---|---|---|---|
| 4,469,569 | A | | 9/1984 | Tomaszewski et al. ....... 204/52 |
| 6,197,181 | B1 | | 3/2001 | Chen ................... 205/123 |
| 6,224,737 | B1 | | 5/2001 | Tsai et al. ............... 205/123 |
| 6,319,616 | B1 | * | 11/2001 | Lopatin et al. ............ 428/469 |
| 6,387,800 | B1 | * | 5/2002 | Liu et al. ................ 438/653 |
| 6,433,379 | B1 | * | 8/2002 | Lopatin et al. ............ 257/301 |
| 6,444,110 | B2 | * | 9/2002 | Barstad et al. ........... 205/123 |
| 6,489,231 | B1 | * | 12/2002 | Kumar et al. ............. 438/627 |

FOREIGN PATENT DOCUMENTS

WO    WO 01/24239 A1   *   4/2001

OTHER PUBLICATIONS

Hosoi et al., "Two–step Copper Electroplating Technique Using Seed Enhancement Step with Alkali–Metal–Free Copper Pyrophosphate Bath," Proceedings of the International Interconnect Technology Conference, Jun. 2001.

* cited by examiner

*Primary Examiner*—Edna Wong
(74) *Attorney, Agent, or Firm*—Luedeka, Neely & Graham

(57) ABSTRACT

A method for depositing a metal conduction layer in a feature of a substrate is provided. The method includes forming the feature in the substrate, the feature having a width dimension of less than about a tenth of a micron. A barrier layer is deposited on the substrate, preferably using a self ionized plasma deposition process, where the barrier layer has a thickness of no more than about three hundred angstroms. A substantially continuous seed layer is deposited on the barrier layer, where the seed layer has a thickness of less than about three hundred angstroms. A conduction layer is deposited on the seed layer from an alkaline electroplating bath, where the electroplating bath contains an electroplating solution selected from the group consisting a pyrophosphate solution, an alkaline cyanide solution and an alkaline metal ion complexing solution. The process is adaptable to electroplating features on a substrate wherein the features have a width dimension of less than about one tenth of a micron.

16 Claims, 1 Drawing Sheet

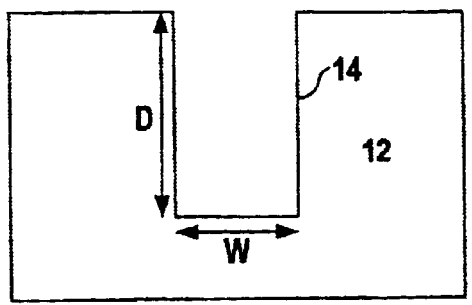
Fig. 1 (Prior Art) 10
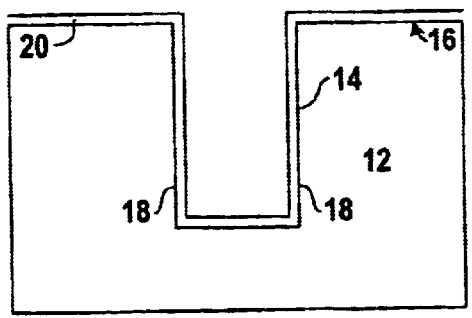
Fig. 2 (Prior Art)
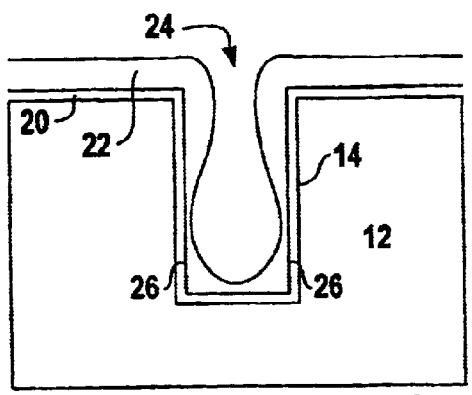
Fig. 3 (Prior Art)
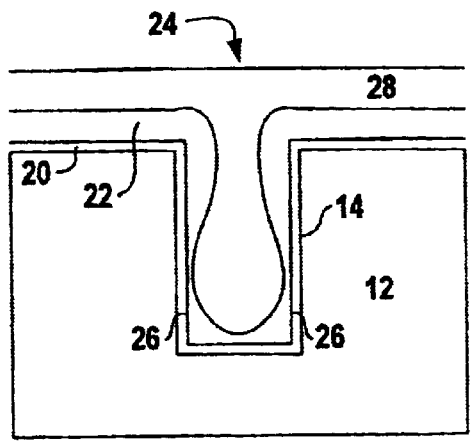
Fig. 4 (Prior Art)
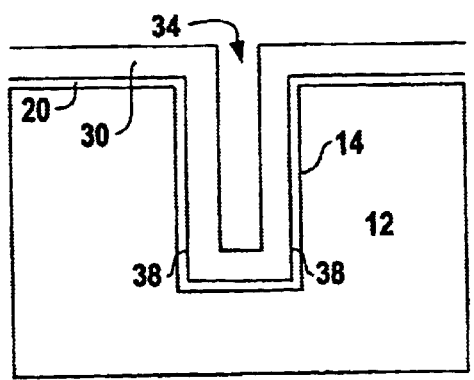
Fig. 5 32
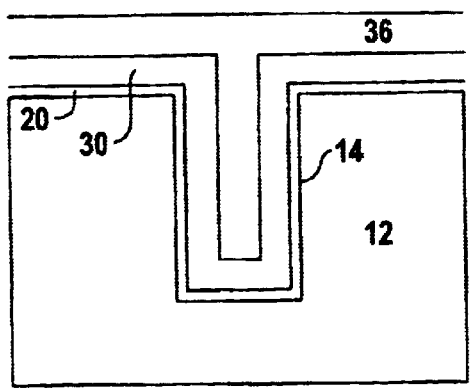
Fig. 6

ALKALINE COPPER PLATING

The invention relates generally to the field of integrated circuit fabrication and, in particular, to improved metallization methods useful in the production of semiconductor devices.

BACKGROUND

During the manufacture of integrated circuits, such as semiconducting devices, various conductive and insulative layers of material are deposited on a substrate to provide circuits and interconnects between the circuits. As integrated circuits continue to shrink in size and become more powerful, newer and better manufacturing techniques are devised to improve their performance.

For example, current copper metallization schemes include providing features such as trenches, slots, vias or holes in a semiconductor substrate, depositing a barrier layer in the features, depositing a seed layer on the barrier layer and depositing copper from an electrochemical deposition acid bath to fill the various features. In order to achieve suitable electrical performance of the semiconductor device, adhesion between the electrochemical deposition copper and the barrier layer is desired. A continuous physical vapor deposited seed layer typically provides suitable adhesion between the barrier layer and the electroplated copper layer.

However, the seed layer often has poor step coverage, particularly for high aspect ratio features and tends to be oxidized to copper oxide upon exposure to air. The oxide layer may be as thick as sixty angstroms or more. Upon submersion of the device in an acidic copper electroplating bath, the copper oxide layer tends to be removed by the acidic bath solution, leaving a thinner or nonexistent seed layer. For features having high aspect ratios and width dimensions of a tenth of a micron or less, conventional seed layers having five percent to ten percent step coverage will typically not work, because the features are effectively closed off by such a thick seed layer. A thinner seed layer, however, tends to be insufficient to provide suitable seed layer coverage of the feature sidewalls once the oxide layer is removed by the electroplating bath.

Thus, there continues to be a need for improved methods for electroplating features with metal on a substrate.

SUMMARY

The above and other needs are met by a method for depositing a metal conduction layer in a feature of a semiconductor device. The method includes the steps of forming a feature in a semiconductor substrate, where the feature has a width dimension of less than about a tenth of a micron. A barrier layer is deposited on a substrate using a self ionized plasma deposition process, the barrier layer having a thickness of no more than about three hundred angstroms. A seed layer is deposited on the barrier layer, where the seed layer has a thickness of less than about three hundred angstroms to provide a substantially continuous seed layer. The conduction layer is electroplated on the seed layer from an alkaline electroplating bath, where the electroplating bath contains an electroplating solution selected from the group consisting of a pyrophosphate solution, an alkaline cyanide solution and an alkaline metal ion complexing solution.

In another aspect the invention provides a method for electroplating a semiconductor device including the steps of depositing a barrier layer on a substrate using a self ionized plasma deposition process, where the barrier layer has a thickness of no more than about three hundred angstroms. A seed layer is deposited on the barrier layer to provide a seed layer having a thickness ranging from about two hundred angstroms to about three hundred angstroms. A conduction layer is electroplated on the seed layer to provide an electroplated semiconductor device, wherein the electroplating bath has a pH above about seven.

An advantage of the invention is that a metal such as copper may be deposited on a substrate in features which have a width dimension of less than about one tenth of a micron and high aspect ratios. Acidic electroplating solutions are unsuitable for depositing conduction metals in extremely narrow features because the acidic solutions tend to dissolve the metal oxide layer formed from the seed layer, which for narrow features with high aspect ratios may include the entire seed layer, thereby providing "holes" or seed layer deficient areas on the side walls of the features.

Providing a seed layer thickness sufficient to prevent holes prior to depositing the electroplated metal often results in a seed layer thickness that effectively closes off the feature because of the poor step coverage of the seed layer. In contrast, use of an alkaline electroplating solution enables the use of a thinner seed layer which is not removed during the electroplating process. The alkaline solution may also be effective to reduce any metal oxide of the seed layer to the pure metal, thereby further enhancing the seed layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIGS. 1–4 are cross sectional views of a portion of a substrate, illustrating a conventional acidic electroplating process, and FIGS. 5–6 are cross sectional views of a portion of a substrate, illustrating an electroplating process according to the invention.

DETAILED DESCRIPTION

FIGS. 1–2 depict a method for applying various layers to a substrate 12, such as a substrate for the formation of an integrated circuit 10 such as a semiconductor device. The invention is particularly applicable to metal interconnects provided in vias, such as in a copper dual damascene structure. However, the invention is equally applicable to electroplating of other metal structures on other substrates. As used herein, a reference to a metal also includes various alloys of the metal.

Prior to depositing the metals on the substrate 12, the substrate is preferably etched to form a feature such as feature 14. The substrate 12 is preferably etched using conventional techniques such as photolithographical processing. In the figures, feature 14 is illustrated as a trench. However, the invention is applicable to depositing a metal in a wide variety of features such as holes, vias, trenches, slots and the like. For the purposes of this invention, the type of feature is not particularly important. However, the invention is applicable to features having a depth D, and a width dimension W of less than about one tenth of a micron. For features having such small width dimensions W and a high aspect ratio (D/W), it is difficult to deposit metal in the feature using conventional electroplating techniques.

A barrier layer 20 is preferably deposited on the substrate surface 16 and on the side walls 18 of the feature 14. The barrier layer 20 is preferably provided on a substrate 12 such as silicon to, for example, prevent the electromigration of the electroplated metal into the substrate 12. While the barrier layer 20 may be applied directly to the substrate 12, it is preferable to apply such layer 20 to insulating or dielectric layers already on the substrate 12. Suitable dielectric or insulating layers (not shown) for a silicon substrate 12 may include silicon oxide, such as silicon dioxide, silicon nitride, glass, and other such materials. For clarity and simplicity in the explanation, only the barrier layer 20, seed layer and metal layer applied according to the present invention are shown and discussed in detail herein.

To apply the barrier layer 20 to the substrate 12, the substrate 12 is preferably inserted in a deposition chamber. In the case of subsequent electroplating with copper, the barrier layer 20 is preferably comprised of a material selected from the group consisting of tantalum nitride, titanium nitride and nitrided titanium-tungsten. The barrier layer 20 deposition process is preferably selected from sputtering, low pressure chemical vapor deposition and self ionized plasma physical vapor deposition.

The barrier layer 20 is preferably applied to the substrate 12 with a thickness of no more than from about one hundred angstroms to about three hundred angstroms. The relatively thin barrier layer 20 tends to result in an increase in smoothness and reflectance of the electroplated conduction layer. According to the invention, the barrier layer 20 is preferably applied in a self ionized plasma with an alternating current bias of no less than about three hundred watts. Other parameters for the deposition are set as for standard processing.

The barrier layer 20 may include an optional adhesion layer. The optional adhesion layer is preferably comprised of tantalum. As with the barrier layer 20, the adhesion layer is preferably applied in an self-ionized plasma deposition process using an alternating current bias of no less than about three hundred watts. As before, other parameters for the deposition are set as for standard processing.

With reference to FIG. 3, a seed layer 22, preferably containing metal ions similar to or compatible with the metal to be applied using the subsequent electroplating process, is deposited on the barrier layer 20. The seed layer 22 is preferably copper in the case of copper electroplating. In a conventional electroplating process, the seed layer 22 is deposited with a thickness of from about one thousand angstroms to about two thousand angstroms, and most preferably about twelve hundred and fifty angstroms. As with the barrier layer 20 and optional adhesion layer, the seed layer 22 is preferably applied in a self ionized plasma deposition with an alternating current bias of no less than about one hundred and fifty watts, and most preferably no less than about three hundred watts. As before, other parameters for the deposition are set as for standard processing.

As illustrated in FIG. 3, the feature 14 has a high aspect ratio, i.e., the ratio of the depth D of the feature 14 to its diameter or width W ranges from about four to about ten. As a result of the high aspect ratio, the step coverage of the seed layer 22 during the seed layer deposition process may range from about five percent to about ten percent. However, for a feature having a diameter or width dimension of about one tenth of a micron on less, the nominal maximum seed layer thickness is necessarily less than about five hundred angstroms. Otherwise, the entrance 24 to feature 14 tends to be closed off with the seed layer 22 as shown in FIG. 3. Accordingly, for a seed layer thickness of about A five hundred angstroms, the barrier layer covered side walls 26 of the feature 14 may contain only from about twenty-five angstroms to about fifty angstroms of seed layer 22.

The seed layer 22 tends to be susceptible to oxidation upon exposure to air, particularly in the case of a copper seed layer 22. For copper, the copper oxide layer may be as thick as sixty angstroms. The metal oxide is removed in an acidic electroplating bath. If the thickness of the seed layer 22 on the barrier layer covered side walls 26 is less than about sixty angstroms, all of the seed layer tends to be removed by the acidic electrolytic bath leaving, holes or seed layer voids on the side walls 26.

In the case of the prior art process, a conduction layer 28 is deposited on the seed layer 22 from an acidic electroplating bath in an electroplating process. The conduction layer 28 is preferably formed of the same material as the seed layer 22, which is most preferably copper. The resulting conduction layer 28 preferably has a thickness ranging from about four thousand angstroms to about three microns. As seen in FIGS. 3 and 4, if the seed layer 22 has a thickness sufficient to maintain seed layer coverage of the feature side walls 26 after removal of the metal oxide layer, the seed layer 22 often effectively closes off the entrance 24 to the feature 14. Using less seed layer 22 deposition results in inadequate coverage of the side walls of the feature 14 due to poor step coverage during the seed layer 22 deposition process, resulting in poor adhesion between the conduction layer 28 and the feature side walls 26.

In order to remedy the deficiencies of the prior art electroplating process, an alkaline electroplating bath is used for depositing the metal conduction layer in the substrate features 14. An alkaline electroplating bath may be selected from the group consisting of a pyrophosphate solution, an alkaline cyanide solution and an alkaline metal ion complexing solution. Commercially available alkaline electroplating solutions are ready mixed salts such as those solutions available from Electroplating Industries, Inc. of Clinton Township, Michigan and from Zinex Corporation of Oxnard, California under the trade name COBRE.

A preferred alkaline electroplating solution preferably has a pH ranging from about 8.2 to about 10.5 for use at a temperature ranging from about 130° to about 155° F. at a current density ranging from about ten to about thirty milliamps per square centimeter. The pH of the electroplating solution is preferably maintained by using potassium hydroxide, ammonium hydroxide, or sodium hydroxide in the bath solution. The electroplating solution also preferably includes additives such as chlorides, surfactants, suppressors, complexing agents and buffering agents. Suitable complexing agents may be selected from ethylene diamine tetracetic acid, ethylene diamine, citric acid, and salts thereof. When citric acid or ethylene diamine is used, boric acid may be used to aid in maintaining the desired pH.

The plating rate of the alkaline plating solution may be increased by increasing the metal content of the solution, which typically ranges from about ten grams per liter of metal to about fifty grams per liter of metal. It is also particularly preferred to use a high frequency pulse reverse waveform for the electroplating process. A preferred pyrophosphate copper plating bath for use according to the invention includes from about twenty seven grams per liter copper to about thirty three grams per liter copper, from about one hundred and fifty five grams per liter of pyrophosphate to about two hundred and fifty grams per liter of pyrophosphate, from about five to about ten grams per liter nitrate, from about one grams per liter ammonia to about three grams per liter ammonia, from about fifteen grams per liter oxalate to about thirty grams per liter oxalate and less than about forty grams per liter orthophosphate.

Referring now to FIGS. 5 and 6, the advantages of the invention are illustrated. As described above, a substrate 12 is prepared for deposition of the metal conducting layer by forming features 14 in the substrate. A barrier layer 20 as set forth above is deposited on the substrate 12 as shown. Next a substantially thinner seed layer 30 is deposited on the barrier layer 20. The seed layer 30 preferably has a thickness ranging from about two hundred angstroms to about three hundred angstroms, which even with a five percent step coverage is sufficient to provide at least a minimum of ten angstroms of seed layer 30 on the sidewalls of the feature 14.

Since an acidic electroplating bath is avoided in the claimed process, any copper oxide layer forming as a result of exposure of the seed layer 30 to air is preferably not removed when the integrated circuit 32 is placed in the alkaline electroplating bath solution. Accordingly, there is preferably no need for an intermediate step of depositing additional seed metal in the feature 14 prior to conducting the electrodeposition process. Also, the thinner seed layer 30 is preferably not thick enough to close off the entrance 34 to the feature 14, so that metal may be deposited within the feature.

During the electrodeposition process, the conducting metal is applied as a layer 36 from the electroplating bath. The conducting metal layer 36 preferably fills the feature 14 as shown in FIG. 6. Good adhesion of the conduction layer 36 to the seed layer 30 in the feature 14 is provided because there is no complete loss of the seed layer 30 on the barrier layer 20 covered feature 14 side walls 38 when using an alkaline electroplating bath. Subsequent to the electroplating step, conventional planarizing or other processing steps such as additional layer deposition may be conducted to form the finished semiconductor device.

It is appreciated that there are many steps that are required to accomplish the processing as described above, and that some intermediate steps, such as patterning, etching and stripping steps, have been omitted. However, those steps which are not completely described above are preferably accomplished according to the processes that are known to be compatible with the materials and processes as described above. Those steps which are not described herein have been omitted so as to not unnecessarily encumber this description of the more relevant portions of the invention.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for depositing a metal conduction layer in a feature of a substrate, the method comprising the steps of:
    forming the feature in the substrate, the feature having a width dimension of less than about one tenth of a micron,
    depositing a barrier layer on the substrate,
    depositing a seed layer on the barrier layer, the seed layer having a thickness of less than about three hundred angstroms to provide a substantially continuous seed layer, the seed layer forming a surface oxide layer after the seed layer is formed, and
    electroplating the conduction layer onto the surface oxide layer of the seed layer from an alkaline electroplating bath, the electroplating bath containing an electroplating solution selected from the group consisting of a pyrophosphate solution, an alkaline cyanide solution and an alkaline metal ion complexing solution.

2. The method of claim 1 wherein the barrier layer is selected from the group consisting of tantalum nitride, titanium nitride, and nitrided titanium-tungsten.

3. The method of claim 1 wherein the seed layer comprises copper.

4. The method of claim 1 wherein the conduction layer comprises copper.

5. The method of claim 1 wherein the barrier layer is deposited with an alternating current bias of no less than about three hundred watts.

6. The method of claim 1 wherein the seed layer is deposited with an alternating current bias of no less than about three hundred watts.

7. The method of claim 1 wherein the barrier layer is deposited to a total thickness that is sufficient to ensure an adequate barrier between the conduction layer and the substrate.

8. An integrated circuit having a conductive metal system made by the method of claim 1, with at least a portion of the surface oxide layer disposed between the seed layer and the conduction layer.

9. A method for electroplating a substrate comprising the steps of:
    depositing a barrier layer on the substrate using a self ionized plasma deposition process, the barrier layer having a thickness of no more than about three hundred angstroms,
    depositing a seed layer on the barrier layer to provide a seed layer having a thickness ranging from about two hundred angstroms to about three hundred angstroms, the seed layer forming a surface oxide layer after the seed layer is formed, and
    electroplating a conduction layer onto the surface oxide layer of the seed layer to provide an electroplated layer, wherein the electroplating bath has a pH above about seven.

10. The method of claim 9 wherein the barrier layer is selected from the group consisting of tantalum nitride, titanium nitride, and nitrided titanium-tungsten.

11. The method of claim 9 wherein the seed layer comprises copper.

12. The method of claim 9 wherein the conduction layer comprises copper.

13. The method of claim 9 wherein the barrier layer is deposited with an alternating current bias of no less than about three hundred watts.

14. The method of claim 9 wherein the seed layer is deposited with an alternating current bias of no less than about three hundred watts.

15. The method of claim 9 wherein the electroplating bath is provided by an alkaline electroplating solution selected from the group consisting of a pyrophosphate solution, an alkaline cyanide solution and an alkaline metal ion complexing solution.

16. An integrated circuit having a conductive metal system made by the method of claim 9, with at least a portion of the surface oxide layer disposed between the seed layer and the conduction layer.

* * * * *